July 5, 1966 R. E. JOHNSON ETAL 3,259,815

GALLIUM ARSENIDE BODY CONTAINING COPPER

Filed June 28, 1962 2 Sheets-Sheet 1

ROWLAND E. JOHNSON
ERNEST C. WURST, JR.
INVENTORS

BY Robert C. Peterson

ATTORNEY

July 5, 1966 R. E. JOHNSON ETAL 3,259,815

GALLIUM ARSENIDE BODY CONTAINING COPPER

Filed June 28, 1962 2 Sheets-Sheet 2

INVENTORS
ROWLAND E. JOHNSON
ERNEST C. WURST, JR.

United States Patent Office 3,259,815 Patented July 5, 1966

3,259,815

GALLIUM ARSENIDE BODY CONTAINING COPPER

Rowland E. Johnson and Ernest C. Wurst, Jr., Dallas, Tex., assignors to Texas Instruments Incorporated, Dallas, Tex., a corporation of Delaware Filed June 28, 1962, Ser. No. 206,050
3 Claims. (Cl. 317—237)

Figure 1:
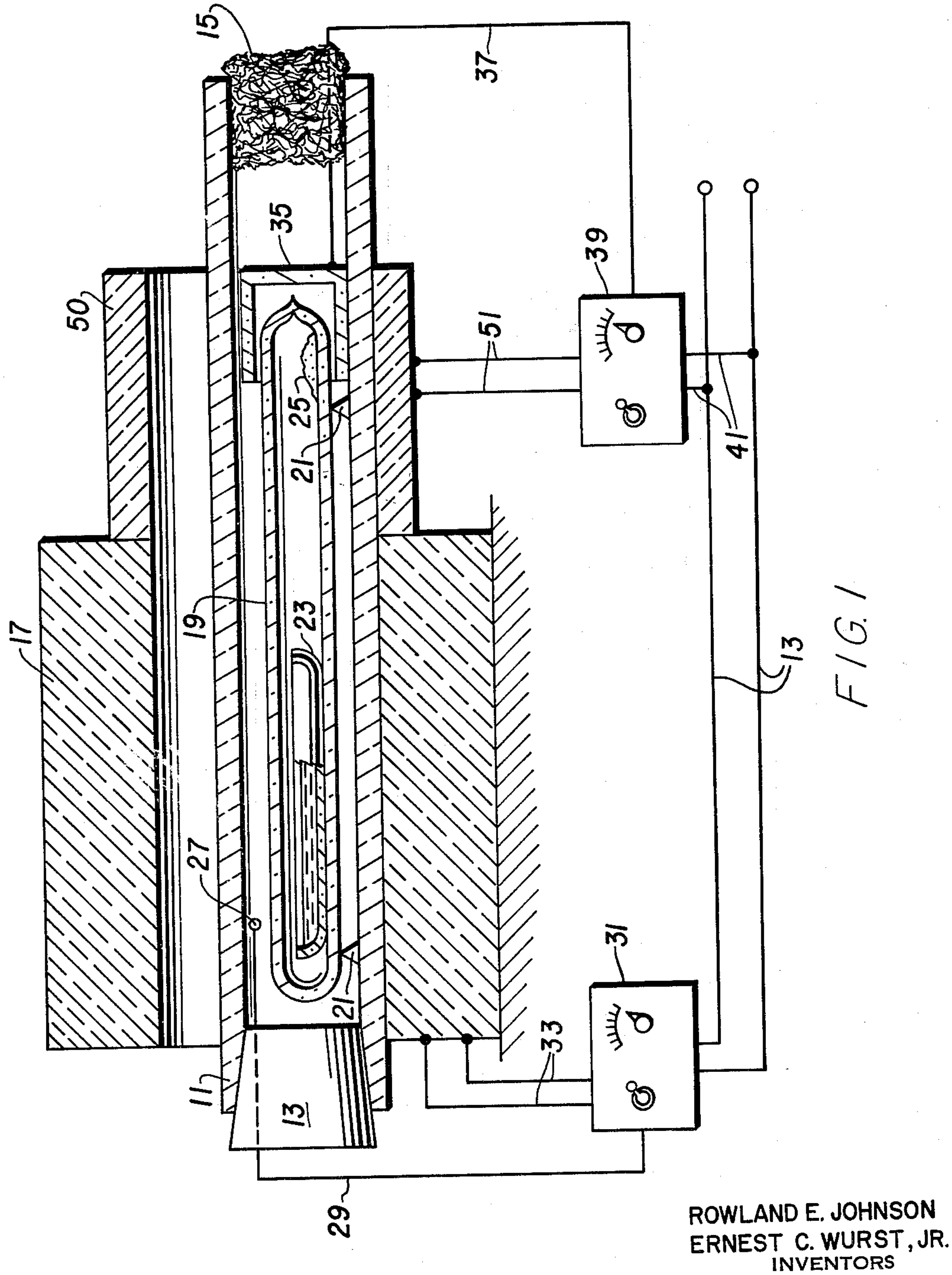

This invention relates to compound semiconductor processes and devices and more particularly to tunnel diodes and Group III–V compound semiconductor material suitable for use in "tunnel" diodes.

The term "Group III–V compound" as used herein means a compound of elements selected from Groups III*a* and V*a* of the periodic table according to Mendeleeff as now generally portrayed.

Although the Group III–V compound semiconductor materials, particularly gallium arsenide, are very useful for producing semiconductor devices, difficulties in adding required amounts of significant impurities or "dopes" to the pure material to produce p- and n-type regions have been encountered. Such problems are prevalent in making compound semiconductor tunnel diodes.

Tunnel diodes are crystal semiconductor devices having single, very sharp p-n junctions, the crystals being doped to degeneracy on either side of the junctions, i.e., containing relatively large amounts of donor or acceptor impurities. The term "degeneracy" is used herein in the classical sense to refer to semiconductor material in which the Fermi level does not lie in the forbidden band but is either in the conduction band (degenerate N-type) or the valence band (degenerate P-type). Tunnel diodes exhibit a current-voltage characteristic having a large negative resistance region, and thus are useful in making oscillators and amplifiers.

Difficulties prevail in achieving appropriate doping levels in Group III–V compound semiconductor materials for making tunnel diodes having low junction current operating characteristics. Heretofore, the only technique for producing such a tunnel diode having a low junction current was etching the junction to extremely small dimensions, a highly impractical technique to achieve junction currents in the order of 100 micro amps.

Briefly, in accordance with the invention, a compound semiconductor such as gallium arsenide is produced concurrently doped to degeneracy with a p-type impurity such as zinc and to the maximum solid solubility with copper. It is recognized that copper is a p-type dopant; however, it will not provide a degenerate doping level in Group III–V compounds. The compound semiconductor formed is gradient frozen and separated into single crystals. The single crystals of gallium arsenide which remain doped to degeneracy with zinc and contain copper in an amount equivalent to the maximum limit of solid solubility, are fabricated into tunnel diodes.

The tunnel diode is made from the compound semiconductor, such as gallium arsenide, by forming a region therein which is doped to degeneracy with an n-type conductivity impurity producing the p-n junction required. Suitable materials and techniques for making the n-type contact region in the single crystal gallium arsenide are described in U.S. Patent No. 3,012,175, granted to M. E. Jones et al., December 5, 1961, and assigned to the same assignee as the instant application.

It is therefore an object of the invention to provide a Group III–V compound semiconductor material which may be fabricated into tunnel diodes, having relatively low junction current densities;

Another object of the invention is to provide a Group III–V compound semiconductor tunnel diode having a low junction current and a relatively high peak to valley ratio;

Another object of the invention is to provide a gallium arsenide tunnel diode having a low junction current and a relatively high peak to valley ratio;

Still another object of the invention is to provide a method of producing p-type gallium arsenide doped to the maximum solid solubility with copper which is useful for making low junction current tunnel diodes.

A still further object of the invention is to provide a Group III–V compound semiconductor tunnel diode having an improved stability resulting from the inclusion of an excess amount of copper in the compound.

Figure 2:
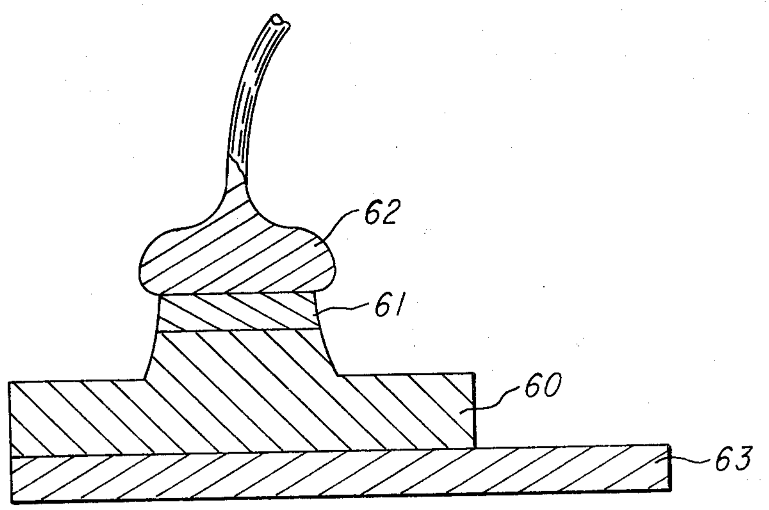

These and other objects and advantages of the invention will become apparent as the following description proceeds, taken in conjunction with the appended claims and the accompanying drawings in which FIG. 1 is a sectional view of the apparatus for producing Group III–V compound semiconductor material in accordance with the principles of the invention, and FIGURE 2 is a sectional view of a tunnel diode made in accordance with the present invention.

One manner in which highly doped ($10^{20}$ carriers per cc.) p-type conductivity compound semiconductor material may be formed, containing copper at the maximum limit of solid solubility, will now be described using gallium arsenide as a typical compound semiconductor and making reference to FIGURE 1 which illustrates suitable apparatus therefor.

The apparatus comprises a ceramic tube 11 of generally cylindrical form, which may be closed at one end by a suitable plug 13 and at the other end by a plug 15 of quartz or glass wool to prevent cool air currents from flowing through the tube. The tube 11 is partially situated within a furnace 17 of ceramic, metal, or other suitable material. A second furnace 50 surrounds another portion of the tube 11, as shown. Within the tube 11 is a sealed quartz reaction chamber 19 resting upon supports 21 provided therefor. The sealed chamber 19 contains at one end, well within the furnace 17, a quartz boat 23, and at its other end, which is exterior to the furnace 17 but within the furnace 50, a quantity of arsenic, the more volatile element of the compound semiconductor gallium arsenide to be formed. A thermocouple 27, connected by a wire 29 to a temperature controller 31, is mounted within the tube 11. The controller 31 effects regulation of the temperature at one end of the furnace 17 through control of the power delivered thereto through wires 33. A support 35 surrounding the other end of the sealed chamber 19 contains a second thermocouple which is connected by means of a wire 37 to a second temperature controller 39 which effects regulation of the temperature in furnace 50 through control of the power delivered thereto through wires 51. Wires 13 serve the furnaces and the temperature controllers with electrical energy.

The boat 23 within one end of the sealed chamber 19 contains an amount of gallium, one element of the compound semiconductor gallium arsenide to be formed, and an excess amount of the p-type doping agent along with an excess amount of copper. By an excess amount of doping agent is meant that amount which will dope the gallium arsenide to degeneracy. By an excess amount of copper is meant that amount required to exceed the solid solubility of copper in the total amount of solid gallium arsenide material which will be formed within the boat 23. The material 25 at the other end of the sealed chamber 19 is the more volatile element or arsenic of the compound gallium arsenide to be formed. The temperature controller 31 is adjusted to maintain the temperature of the boat 23 above the melting point of gallium arsenide, hence, the temperature would be above 1234° C. Furnace 17 is so constructed that a 20–45° C. temperature gradient from one end to the other of boat 23 is maintained. Such a temperature gradient may be achieved through appropriate placement of the heating coils within the furnace, or by other known means. The hotter end of the boat 23 may be maintained at approximately 1260° C. to 1295° C. during formation of gallium arsenide. The end of the sealed chamber 19 containing the material 25 should be maintained at the temperature at which the vapor pressure of the material 25 is correct to produce a stoichiometric melt of the compound semiconductor in the boat 23. Since in this example the material 25 is arsenic, the end of chamber 19 containing the arsenic should be maintained at a temperature of approximately 607° C. In this manner, the temperature at the cool end of the chamber 19 is sufficient to volatilize the arsenic contained therein, and the temperature at the hot end of the chamber 19 is sufficient to maintain boat 23 and its contents above the melting point of the compound gallium arsenide. At these temperatures, the volatilizing arsenic forms an atmosphere within the chamber 19, and combines with the element gallium in the boat 23 to produce the stoichiometric molten compound semiconductor gallium arsenide containing an excess of the doping agent and copper.

After maintaining the molten material under the conditions outlined above for a period of time sufficient for the stoichiometric compound gallium arsenide to form, which may be about five hours, the melt is subjected to gradient freezing by gradually reducing the temperature in the furnace 17 over a period of from four to eight hours while maintaining substantially constant the temperature gradient of about 20–45° C. across the boat 23. In this manner, the compound semiconductor gallium arsenide begins freezing at the cooler end of the boat 23, and progressively freezes until the temperature at the hot end of the boat 23 falls below the melting temperature of gallium arsenide. Due to the segregation characteristics of the dope and the copper in the freezing material, the excess materials will be swept by the advancing freezing interface of the crystalline mass to the last frozen end of the compound gallium arsenide, providing a supersaturated portion of material at the finally frozen end of the crystalline mass.

The frozen mass will usually by polycrystalline. However, when slowly cooled as described, the individual crystals in the mass will be quite large and, on occasion, the mass will seed itself and freeze as a single crystal. Alternatively, the molten mass can be seeded to cause a single crystal to grow during cooling.

By this method, there is formed a crystalline mass of highly doped Group III–V compound semiconductor material. Although the mass is polycrystalline, the individual crystals of the material are so large that slices of the material, as formed, are suitable for fabrication directly into tunnel diode devices. After the formation of the crystalline mass itself, the first frozen end, in which the individual crystals are too small, and the last frozen end, which is supersaturated with the doping materials and copper, may be cut off to leave the more desirable middle portion. This middle portion is then sliced and diced into wafers, which are then suitably etched and polished preparatory to producing devices. After preparation of the wafers, suitable contacts are attached to the wafers, one ohmic and one rectifying. Leads are then attached to the contacts, and the devices masked for etching. The junction area is etched down to approximately 50 to $200 \times 10^{-6}$ cm. sq. The masking is then removed and the device is cleaned and encapsulated to provide a finished product. Hereinafter follows a specific example of the method and article of the invention. A typical device is shown in FIGURE 2. The device is comprised of a P-type copper doped wafer 60 as described above. Contact 62 is alloyed to the wafer 60 to form an N-type regrowth region 61. An ohmic contact 63 is formed on the opposite side of the wafer 60 and the device is then masked and etched to reduce the P–N junction area.

EXAMPLE I

Using the apparatus shown in FIG. 1, 25 grams of 99.9999% pure gallium, 1 gram of 99.95% pure zinc and 0.005 gram of 99.95% pure copper were placed into the boat 23, and 40 grams of 99.9995% pure arsenic were placed at the right end of sealed chamber 19. The boat 23 was placed toward the left end of chamber 19. The chamber 19 was then evacuated, sealed, and arranged in tube 11 within the gradient freeze furnace and the vapor pressure control furnace 50, as shown in the drawing. The furnace 17 was adjusted to established one end of the boat 23 at a temperature of 1290° C. and the other end at 1245° C. thus providing a 45° C. temperature gradient along the boat 23. The other end of the chamber 19 was heated to an arsenic control temperature of 607° C. The temperature conditions were held for a period of five hours, during which time molten stoichiometric gallium arsenide containing dissolved zinc and copper formed in boat 23. The gallium arsenide was then frozen (by slowly lowering the power to furnace 17) over an eight hour period, all the while preserving the temperature gradient along the boat 23. Next, the boat 23 was cooled to 600° C. over a four-hour period and then the chamber 19 containing the boat 23 was removed from the furnace and cooled to room temperature. After removing the gallium arsenide ingot from the sealed chamber 19 and the boat 23, it was evaluated by preparing diodes therefrom by slicing and dicing the material, lapping and etching the dice, and alloying a tin dot to one side of each die to form a rectifying contact and soldering (with zinc-doped gold) a copper ohmic contact tab to the other side of each die. The diodes were etched to form a suitable junction area and tested to determine the tunnel diode characteristics. The characteristics of the tunnel diodes formed are presented in Table I below.

*Table I*

| Unit No. | Junction Area×$10^6$, cm.$^2$ | $I_p$, ma. | $I_v$, ma. | $I_p/I_v$ | Peak Current Density, $J_{P_2}$, amps./cm.$^2$ |
|---|---|---|---|---|---|
| 1 | 44.1 | .92 | .05 | 18.4 | 21 |
| 2 | 69.0 | .29 | .012 | 24.2 | 4.2 |
| 3 | 142.0 | .37 | .026 | 14.2 | 2.6 |
| 4 | 81.0 | .3 | .01 | 30.0 | 3.7 |

There has been described, in this specification, a new and improved tunnel diode, diode material, and method and apparatus for producing such diodes. It is realized that the above description will suggest to others skilled in the art new and other manners of using the principles thereof without departing from the spirit of this invention. It is therefore, intended that this invention be limited only by the scope of the appended claims.

What is claimed is:

1. A low junction current tunnel diode comprising a single crystal body of gallium arsenide having contiguous N-type and P-type regions, said N-type region being doped to degeneracy with an N-type conductivity doping agent, said P-type region containing copper in an amount of about the maximum solid solubility of copper in gallium arsenide and doped to degeneracy with a P-type conductivity doping agent, and electrical contacts to said N-type region and said P-type region.

2. The tunnel diode of claim 1, wherein said P-type conductivity doping agent is zinc.

3. Monocrystalline gallium arsenide semiconductor material containing copper in an amount of about the maximum solid solubility of copper in monocrystalline gallium arsenide, said monocrystalline gallium arsenide being doped to degeneracy with a P-type conductivity doping agent.

(References on following page)

References Cited by the Examiner

UNITED STATES PATENTS

| | | | |
|---|---|---|---|
| 2,798,989 | 7/1957 | Welker | 317—237 |
| 2,814,004 | 11/1957 | Goodman | 317—237 |
| 2,871,100 | 1/1959 | Guire et al. | 317—237 |
| 2,916,678 | 12/1959 | Bube et al. | 317—237 |
| 3,012,175 | 12/1961 | Jones et al. | 317—237 |
| 3,022,452 | 2/1962 | Williams et al. | 317—237 |
| 3,059,040 | 10/1962 | Schreiner | 252—62.3 |
| 3,071,715 | 1/1963 | Hill | 317—237 |
| 3,096,287 | 7/1963 | Rabenau | 252—62.3 |
| 3,131,096 | 4/1964 | Sommers | 317—237 |
| 3,200,017 | 8/1965 | Pell | 148—33 |

OTHER REFERENCES

Fuller, C. S. and J. M. Whelan: "Diffusion, Solubility, and Electrical Behavior of Copper in Gallium Arsenide," pages 173–177 of the book "Physics and Chemistry of Solids," volume 6, 1958.

Weisberg et al.: RCA Technical Notes "Production of High Resistivity Gallium Arsenide, RCA T.N. No. 372, June 1960.

JOHN W. HUCKERT, *Primary Examiner.*

DAVID J. GALVIN, JAMES D. KALLAM, *Examiners.*

A. M. LESNIAK, *Assistant Examiner.*